United States Patent
Weldman et al.

(10) Patent No.: US 8,575,033 B2
(45) Date of Patent: *Nov. 5, 2013

(54) CARBOSILANE PRECURSORS FOR LOW TEMPERATURE FILM DEPOSITION

(75) Inventors: Timothy W. Weldman, Sunnyvale, CA (US); Todd Schroeder, Toledo, OH (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/609,867

(22) Filed: Sep. 11, 2012

(65) Prior Publication Data

US 2013/0065404 A1    Mar. 14, 2013

Related U.S. Application Data

(63) Continuation-in-part of application No. 13/288,157, filed on Nov. 3, 2011, now Pat. No. 8,440,571.

(60) Provisional application No. 61/534,122, filed on Sep. 13, 2011.

(51) Int. Cl.
    *H01L 21/302* (2006.01)
(52) U.S. Cl.
    USPC ........... 438/718; 438/767; 438/769; 438/779; 438/E21.09
(58) Field of Classification Search
    USPC .............................. 438/478, 788–790, E21.09; 428/446–447, 452
    See application file for complete search history.

(56) References Cited

U.S. PATENT DOCUMENTS

| | | | |
|---|---|---|---|
| 6,730,802 B2 | 5/2004 | Shen et al. | |
| 2004/0063984 A1 | 4/2004 | Shen et al. | |
| 2004/0115876 A1 | 6/2004 | Goundar et al. | |
| 2007/0277734 A1 | 12/2007 | Lubomirsky et al. | |
| 2008/0009141 A1 * | 1/2008 | Dubois et al. | 438/758 |
| 2009/0155606 A1 | 6/2009 | Yoon et al. | |
| 2009/0179306 A1 * | 7/2009 | Grill et al. | 257/632 |
| 2010/0003406 A1 | 1/2010 | Lam et al. | |
| 2010/0129994 A1 | 5/2010 | Awad et al. | |

FOREIGN PATENT DOCUMENTS

| | | |
|---|---|---|
| JP | 2003/179054 | 6/2003 |
| KR | 2009/0121361 | 11/2009 |
| WO | WO-95/10638 | 4/1995 |

OTHER PUBLICATIONS

PCT International Search Report and Written Opinion in PCT/US2011/059135, mailed Jul. 10, 2012, 12 pgs.
"PCT International Search Report and Written Opinion in PCT/US2012/054611", mailed on Feb. 28, 2013, 12 pages.
PCT International Preliminary Report on Patentability (Form PCT IB 326) for PCT/US2011/059135, mailed May 16, 2013.

* cited by examiner

*Primary Examiner* — Dung A. Le
(74) *Attorney, Agent, or Firm* — Servilla Whitney LLC

(57) ABSTRACT

Provided are processes for the low temperature deposition of silicon-containing films using carbosilane precursors containing a carbon atom bridging at least two silicon atoms. Certain methods comprise providing a substrate; in a PECVD process, exposing the substrate surface to a carbosilane precursor containing at least one carbon atom bridging at least two silicon atoms; exposing the carbosilane precursor to a low-powered energy sourcedirect plasma to provide a carbosilane at the substrate surface; and densifying the carbosilanestripping away at least some of the hydrogen atoms to provide a film comprising SiC. The SiC film may be exposed to the carbosilane surface to a nitrogen source to provide a film comprising SiCN.

8 Claims, 6 Drawing Sheets

CARBOSILANE PRECURSORS FOR LOW TEMPERATURE FILM DEPOSITION

CROSS-REFERENCE TO RELATED APPLICATIONS

This application claims priority to U.S. Provisional Application No. 61/534,122, filed Sep. 13, 2011, and is a continuation-in-part of U.S. Non-Provisional application Ser. No. 13/288,157, filed Nov. 3, 2011, the contents of both of which are hereby incorporated by reference in their entirety.

TECHNICAL FIELD

Embodiments of the present invention generally relate to the field of film deposition, and specifically to precursors for low temperature deposition of films containing silicon, carbon and nitrogen.

BACKGROUND

In the manufacture of electronic devices such as integrated circuits, a target substrate, such as a semiconductor wafer, is subjected to various processes, such as film formation, etching, oxidation, diffusion, reformation, annealing, and natural oxide film removal. Silicon-containing films are an important part of many of these processes.

Silicon-containing films are used for a wide variety of applications in the semiconductor industry. Examples of silicon-containing films include epitaxial silicon, polycrystalline silicon (poly-Si), and amorphous silicon, epitaxial silicon germanium (SiGe), silicon germanium carbide (SiGeC), silicon carbide (SiC), silicon nitride (SiN), silicon carbonitride (SiCN), and silicon carboxide (SiCO). As circuit geometries shrink to smaller feature sizes, lower deposition temperatures for Si-containing films are preferred, for example, to reduce thermal budgets.

Silicon nitride films have very good oxidation resistance and insulating qualities. Accordingly, these films have been used in many applications, including oxide/nitride/oxide stacks, etch stops, oxygen diffusion barriers, and gate insulation layers, among others. Several methods are known for forming a silicon nitride film on the surface of a semiconductor wafer by Chemical Vapor Deposition (CVD). In thermal CVD, a silane gas, such as monosilane ($SiH_4$) or polysilanes, is used as a silicon source gas.

SiN film formation has also been carried out via atomic layer deposition using halosilane and ammonia. However, this process requires high temperatures, in excess of 500° C., to effect clean conversion and eliminate $NH_4X$ byproducts. In device manufacturing, processes that can be performed at lower temperatures are generally desired for thermal budget and other reasons.

SUMMARY

One aspect of the invention relates to a method of forming a layer on a substrate surface. The method comprises: providing a substrate; in a PECVD process, exposing the substrate surface to a carbosilane precursor containing at least one carbon atom bridging at least two silicon atoms; exposing the carbosilane precursor to a low-powered energy source (e.g., direct plasma) to provide a carbosilane at the substrate surface; and stripping away at least some of the hydrogen atoms to provide a film comprising SiC.

Another aspect of the invention relates to a method of forming a layer on a substrate surface, the method comprising: providing a substrate; in a PECVD process exposing the substrate surface to a carbosilane precursor containing at least one methylene bridging two silicon atoms; exposing the carbosilane precursor to a direct plasma to provide a carbosilane at the substrate surface; stripping away at least some of the hydrogen atoms; and exposing the carbosilane surface to a nitrogen source to provide a film comprising SiCN suitable as a low k dielectric film.

Various embodiments are listed below. It will be understood that the embodiments listed below may be combined not only as listed below, but in other suitable combinations in accordance with the scope of the invention.

In one or more embodiments of either aspect, stripping away at least some of the hydrogen atoms comprises exposing the substrate surface to a plasma containing one or more of He, Ar and $H_2$. In some embodiments of either aspect, the film comprising SiC has a ratio of Si:C approximately matching that of the carbosilane precursor.

In some embodiments of either aspect, the carbosilane precursor is one or more of 1,3,5-trisilapentane, 1,3-disilabutane, 1,3-disilacyclobutane and 1,3,5-trisilacyclohexane. In further embodiments, the carbosilane precursor comprises 1,3,5-trisilapentane. In even further embodiments, the SiC film has a ratio of Si:C of about 3:2. In an alternative embodiment, the carbosilane precursor comprises 1,3-disilabutane.

The process conditions may be varied. In one or more embodiments of either aspect, exposing the carbosilane precursor to a low-powered plasma results in polymerization of the carbosilane. In some embodiments of either aspect, the low-powered plasma has an RF value of about 50 W to about 500 W. In some embodiments, the low-powered plasma has a value of about 10 W to about 200 W. In one or more embodiments of either aspect, the carbosilane precursor is exposed to the low-powered plasma for between 0.10 seconds and 5.0 seconds. In some embodiments of either aspect, the substrate surface has a temperature of about 100 and about 400° C.

In one or more embodiments of either aspect, exposing the carbosilane to a nitrogen source comprises exposing the carbosiliane to a plasma containing nitrogen. In some embodiments, exposing the carbosiliane to a plasma containing nitrogen results in the formation of N—H bonds that promote irreversible attachment of a monolayer of the carbosilane to the substrate surface. In some embodiments, exposing the carbosilane to a nitrogen source comprises flowing ammonia or nitrogen gas.

In some embodiment, the SiC or SiCN film is suitable as a low k dielectric film.

A third aspect of the invention relates to a method of forming a layer on a substrate surface, the method comprising: providing a substrate; exposing the substrate surface to a carbosilane precursor 1,3,5-trisilapentane, 1,3-disilabutane, 1,3-disilacyclobutane and 1,3,5-trisilacyclohexane; exposing the carbosilane precursor to a low-powered plasma to provide a carbosilane at the substrate surface; and exposing the carbosilane to a plasma comprising $H_2$. Any of the above embodiments may also be used with this aspect.

DETAILED DESCRIPTION

Figure 1A:
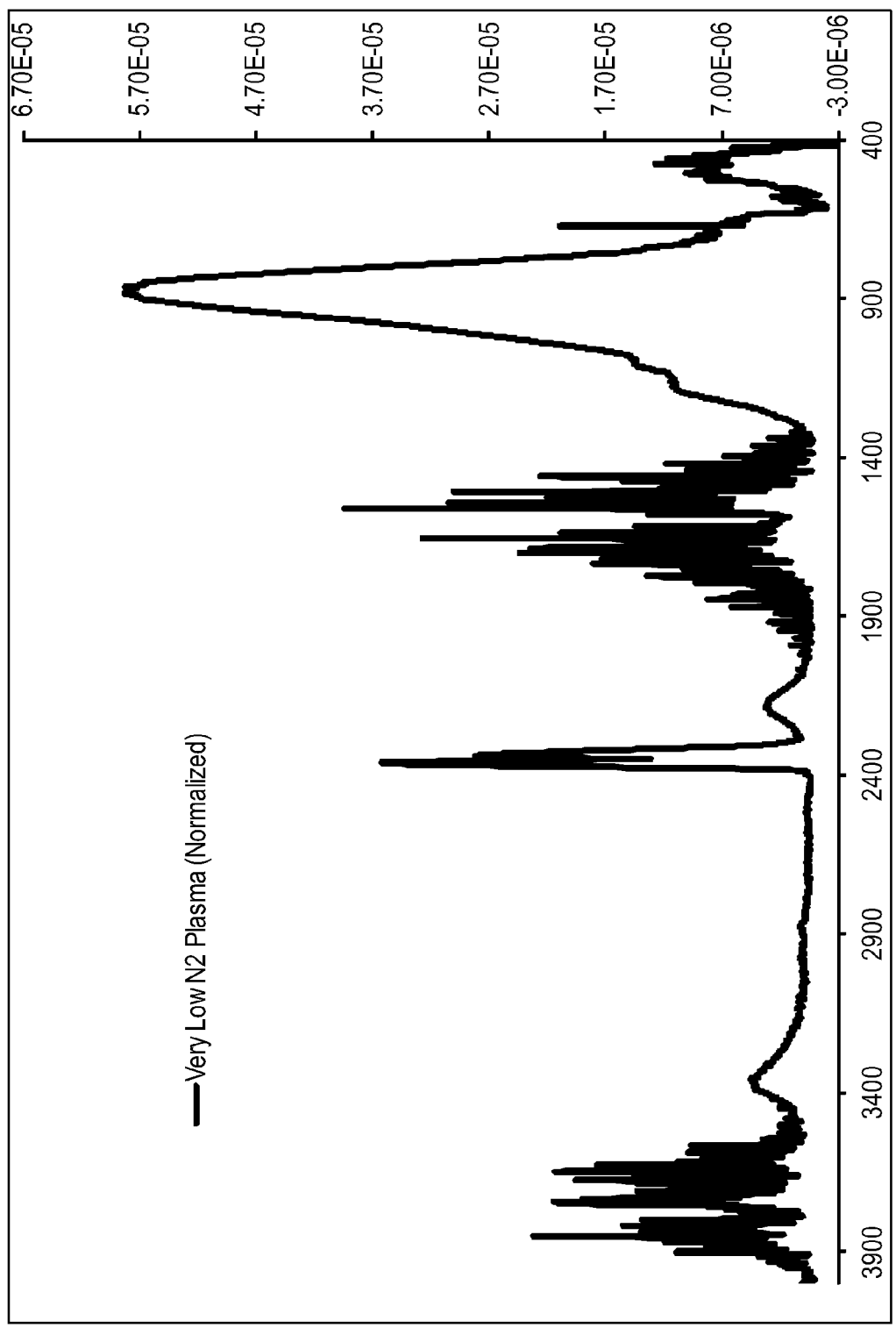
FIGS. 1A-C are Fourier transform infrared spectra of three SiCN films formed in accordance with an embodiment of the invention.

Before describing several exemplary embodiments of the invention, it is to be understood that the invention is not limited to the details of construction or process steps set forth in the following description. The invention is capable of other embodiments and of being practiced or being carried out in various ways.

A "substrate surface" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, glass sheets, ceramic substrates and semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention any of the film processing steps disclosed may also be performed on an underlayer formed on the substrate as disclosed in more detail below, and the term "substrate surface" is intended to include such underlayer as the context indicates.

As used herein, an "SiH-containing precursor" refers to a precursor molecule that contains a plurality of Si—H bonds. SiH-containing precursors include silanes and carbosilanes. The term "silanes" refers to compounds which contain silicon and hydrogen atoms, including silicon-to-hydrogen bonds. The term "carbosilanes," which may be used interchangeably with "organosilanes," refers to compounds that contain silicon, hydrogen and carbon atoms, and contain at least one carbon-to-silicon covalent bond. Thus, a "halogenated Si—H-rich precursor" or "halogenated silane" or "halogenated carbosilane" refers to a precursor molecule where at least one of the hydrogen atoms bonded to a silicon atom is replaced with a halogen. By extension, a "cyanated Si—H-rich precursor" or "cyanated silane" or "cyanated carbosilane" refers to a precursor molecule where at least one of the hydrogen atoms bonded to a silicon atom is replaced with a cyano (CN) group.

As used herein, "containing at least one carbon atom bridging at least two silicon atoms" refers to a carbosilane that contains an Si—C—Si component. The carbon may have two hydrogens, which would constitute a methylene group and result in a Si—$CH_2$—Si component. The silicon atoms may have a wide variety of substituents, including, but not limited to, hydrogen or additional silicon and/or carbon atoms. In some cases, the carbon atom may bridge three or four silicon atoms.

As used herein, "low temperature" refers to processes that are conducted at less than 400° C. In specific embodiments, low temperature refers to less than 300° C., and in more specific embodiments, less than 200° C. and in highly specific embodiments, less than 100° C.

As used herein, "low-powered energy source" refers to a source of energy that will not damage carbosilane precursor deposited at a substrate surface. For example, where the source of energy is a plasma, the RF value is less than about 200 W.

One aspect of the invention relates to a method of forming a layer on a substrate surface, the method comprising providing a substrate, exposing the substrate surface to a carbosilane precursor containing at least one carbon atom bridging at least two silicon atoms, exposing the carbosilane precursor to a low-powered energy source to provide a carbosilane at the substrate surface, densifying the carbosilane, and exposing the carbosilane surface to a nitrogen source. The process then may be repeated to add additional layers.

Described herein are PECVD processes to deposit SiC and SiCN films. Accordingly, one aspect of the invention relates to a method of forming a layer on a substrate surface, the method comprising: providing a substrate; in a PECVD process, exposing the substrate surface to a carbosilane precursor containing at least one carbon atom bridging at least two silicon atoms; exposing the carbosilane precursor to a low powered energy source to provide a carbosilane at the substrate surface; and stripping away at least some of the hydrogen atoms to provide a film comprising SiC. In one or more embodiments, the low powered energy source comprises a direct plasma.

In specific embodiments, carbosilane precursors containing at least one carbon atom bridging at least two silicon atoms are used to produce thin films of SiC. In some embodiments, these thin films of SiC can then be converted to SiCN by displacing some of the carbon atoms from the SiC. Carbosilane precursors, as described herein, are used to deposit a thin layer of a silicon-containing film. While not wishing to be bound by any particular theory, it is thought that the carbosilane is polymerized at the substrate surface after exposure to a low-powered energy source. The carbosilane precursor is exposed to a low-powered energy source, which forms a layer of the precursor on the substrate surface. In one embodiment, exposing the carbosilane precursor to a low-powered energy source comprises exposing the carbosilane precursor to an electron beam. In another embodiment, exposing the carbosilane precursor to a low-powered energy source comprises exposing the carbosilane precursor to a low-powered plasma. In a specific embodiment, the low-powered plasma has a value of about 100 W to about 200 W or about 50 W to about 500 W. In some embodiments, the RF value of the plasma ranges from about 10, 20, 30, 40, 50, 60 70, 80 or 90 W to about 175, 200, 225, 250, 275 or 300 W. In another embodiment, the precursor is exposed to the low-powered plasma for between about 0.10 seconds and about 5.0 seconds.

Carbosilane precursors have been demonstrated to undergo efficient densification/dehydrogenation to silicon-rich SiC. Thus, according to various embodiment, carbosilane precursor at the substrate surface is at least partially densified/dehydrogenated. In one embodiment, densification/dehydrogenation is plasma-induced. A helium, argon and/or hydrogen-containing plasma may be used for dehydrogenation. In specific embodiments, dehydrogenation involves the use of plasma containing $H_2$.

In addition to densification/dehydrogenation, nitrogen may be introduced into the SiC layer by nitridation to form SiCN. This occurs by exposing the carbosilane surface to nitrogen source. In one embodiment, this comprises flowing ammonia or nitrogen gas. In an alternative embodiment, nitridation occurs via exposure to a nitriding plasma. In a more specific embodiment, this nitriding plasma comprises $N_2$. In a further embodiment, around 5% of the plasma comprises $N_2$. In yet another alternative embodiment, nitridation does not occur.

These deposition processes can be accomplished using relatively low RF power conditions and at temperatures lower than previously available. In previous methods, higher temperatures of more than 500° C. were necessary. In specific embodiments, substrate temperature during deposition can be lower than about 400, 350, 300, 250, 200, 150 or 100° C.

Precursors are based on carbosilanes. Carbosilanes, sometimes also referred to as organosilanes, are compounds containing carbon-to-silicon covalent bonds. According to certain embodiments, the carbosilane precursors should be chosen such that there is reduced fragmenting in deposited films. Fragmentation of the film to volatile fragments prevents densification, and causes shrinking and cracking in flowable applications.

Carbosilanes may be linear, branched or cyclic. A particularly suitable type of carbosilane is one that contains a bridging methylene groups between at least two silicon atoms, such that the carbon in the methylene group is bonded to the at least two silicon atoms. In a further embodiment, the methylene group bridges two silicon atoms. Either one, both, or neither of the two silicon atoms may be halogenated or pseudohalogenated. Higher carbosilanes with an extended Si—C—Si backbone are particularly suitable as they tend towards dehydrogenative densification reactions, instead of fragmentation. In another embodiment, the carbosilane contains a bridging $CH_2$ group or simple C atom between three or four silicon atoms respectively. Precursors without such bridging methylene groups, such as those initially containing only terminal methyl substituents may undergo rearrangements on plasma excitation to form methylene bridged carbosilanes and are thus also suitable, though in this case there may also be substantial cleavage of the Si—C bond of the Si—$CH_3$ substituent.

Polycarbosilanes containing more extended backbones of alternating Si—C—Si—C—Si bonds, such as 1,3,5-trisilapentane, are particularly preferable. Examples of suitable carbosilane precursors include, but are not limited to 1,3,5-trisilapentane, 1,3,5-trisilacyclohexane, 1,3-disilabutane, 1,3-disilapropane and 1,3-disilacyclobutane. In a particular embodiment, the carbosilane precursor is 1,3-disilabutane. In another particular embodiment, the carbosilane precursor is 1,3,5-trisilapentane. Where a desired level of carbon is desired and the precursor contains only terminal methyl substituents, it is generally necessary to begin with precursors possessing at least twice the Si:C ratio desired in the final film.

In some cases, the conformality of films deposited using such low power plasma steps may be sufficiently conformal such that even after subsequent densification they may provide "ALD-like" conformality. A useful way to enhance such conformality is to employ a plasma activation step at the end of the activation sequence—such as one resulting in the formation of N—H bonds that promotes the irreversible attachment of the first monolayer of precursor deposited in a low power plasma step, while subsequently deposited materials are bound reversibly, and may re-enter the gas phase and be purged away during a subsequent purge step. Accordingly, in one embodiment, exposing the carbosilane to a plasma containing nitrogen results in the formation of N—H bonds that promote irreversible attachment of a monolayer of the carbosilane to the substrate surface. While the final surface activation, applied immediately prior to the introduction of precursor but after a plasma densification, may be a step involving nitrogen plasma, it may also involve a non plasma step such as simple exposure of the surface to a flow of ammonia ($NH_3$).

Generally, exposure of "seed" films containing Si, C, and H to N containing plasmas is effective for generating films exhibiting N—H functionality as detectable by growth of a characteristic absorption between about 3200-3600 $cm^{-1}$ in the FTIR. Typical conditions entail pressures in the range of 0.5 Torr to 20 Torr and RF power levels (13.56 MHz, direct plasma) of between 25 W and 500 W, for example 100 W for a duration of 2 sec at a total pressure of 4 Torr and partial pressure of nitrogen between about 1 Torr and 3 Torr, the balance being He or Ar. In cases where the film being treated contains very little H (for example if a plasma process has already been performed to remove H) a small amount of hydrogen may also be added to the plasma mixture to promote the generation of more N—H bonding.

The ratio of silicon to carbon in the film may be adjusted, depending on the plasma power, exposure time and temperature. For example, the ratio of Si:C can readily be reduced in a SiCN composition by replacing carbon with nitrogen atoms using post-treatment plasmas. The ratio of C to Si may be increased by utilizing precursors containing a higher initial ratio. In one or more embodiments, the ratio of Si:C is approximately the same as that of the precursor. Thus, for example, in one or more embodiments, if 1,3,5-trisilapentane is used as the precursor, the Si:C ratio of the film may be about 3:2. Generally, carbosilane precursors containing carbon in a bridging position between two silicon atoms can be consolidated to carbide-type ceramics with efficient retention of carbon. On the other hand, carbon is not retained to such extent where the precursor does not contain a bridging carbon atom. For example, precursors based on methylsilanes undergo consolidation with substantial loss of carbon.

Another aspect of the invention relates to exposure of the substrate surface to plasma as part of the process of forming the film or layer. The surface with bound precursor is exposed to a densification/dehydrogenation plasma. Suitable dehydrogenation plasmas include, but are not limited to, $H_2$, He and Ar. The surface is then exposed to a nitriding plasma. Suitable nitriding plasmas include, but are not limited to $N_2$ and ammonia. Exposure to the plasmas may be done substantially simultaneously or sequentially. Substantially simultaneous means that the substrate surface is exposed to both plasmas at the same time, with little exposure time to one plasma at a time. When done sequentially, the dehydrogenating plasma may first be applied, followed by the nitriding plasma. Any number of sequences may be used. In one embodiment, plasma exposure may occur in every step of the process. In another embodiment, plasma exposure may occur every other sequence. Subsequent exposure to a nitriding plasma results in conversion of the SiC film to SiCN.

In one embodiment of this aspect, dehydrogenation and nitridation occur substantially simultaneously. By contrast, in another embodiment, dehydrogenation and nitridation occur sequentially.

Accordingly, in a second aspect of the invention, the invention relates to a method of forming a layer on a substrate surface, the method comprising providing a substrate, exposing the substrate surface to a carbosilane precursor containing at least one methylene bridging two silicon atoms, exposing the carbosilane precursor to a low-powered plasma to provide a carbosilane at the substrate surface, densifying the carbosilane, and exposing the carbosilane surface to a nitrogen source. Such a SiCN may be suitable for use as a low k dielectric film. In one embodiment of this aspect, the low-powered plasma has a value of about 10 W to about 200 W. In a different embodiment of this aspect, the carbosilane precursor is exposed to the low-powered plasma for between 0.10 seconds and 5.0 seconds.

In a different embodiment, the carbosilane precursor is one or more of 1,3,5-trisilapentane, 1,3-disilabutane, 1,3-disilacyclobutane and 1,3,5-trisilacyclohexane. In a more specific variant of this embodiment, the carbosilane precursor is 1,3,5-trisilapentane.

A third aspect of the invention relates to a method of forming a layer on a substrate surface, the method comprising: providing a substrate; exposing the substrate surface to a carbosilane precursor 1,3,5-trisilapentane, 1,3-disilabutane, 1,3-disilacyclobutane and 1,3,5-trisilacyclohexane; exposing the carbosilane precursor to a low-powered plasma to provide a carbosilane at the substrate surface; and exposing the carbosilane to a plasma comprising $H_2$ In some embodiments, one or more layers may be formed during a plasma enhanced chemical vapor deposition (PECVD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PECVD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not required. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/ cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

The approaches of low temperature atomic layer deposition of SiCN and SiC films described above may also be used for the deposition of extremely thin, defect-free and conformal films for applications outside of the electronics industry. Such applications include for the preparation of barrier and passivation layers. Additionally, the low temperature reactivity would make the processes applicable to the coating of organic substrates, including plant- and animal-derived tissues and materials. In some embodiments, the films described herein are used in low k dielectric barrier applications. In one or more embodiments, the deposited films are highly etch resistant and have a refractive index (RI's) of between about 1.7 and 2.2.

EXAMPLES

Example 1

Three SiCN films were deposited using 1,3,5-trisilapentane using the conditions listed in the Table 1. Films 1, 2, and 3 were formed using multistep PECVD deposition and treatment-type sequences, with very low powers (20 W) and short times (0.25 sec) used in the first step. This very low power and short exposure time formed 3-4A of a "seed" layer per cycle. Upon completion of this first step, the flow of the 1,3,5-trisilapentane precursor was turned off. A flow of inert gases was continued until residual traces of the precursor were purged from the process chamber. Once purge was completed, gas flows were readjusted and stabilized at the values selected for the first plasma treatment step and again for a second plasma treatment step as indicated in Table 1. After completion of the full sequence, the entire cycle was then repeated until a desired film thickness was reached, for which the measurements reported here was at least 100 A and more generally 200 A thick.

Films 1, 2, and 3 differed in respect to the plasma densification and nitrogenation steps employed. Film 2 was deposited in the same manner as Film 1, but also featured exposure to a He/Ar plasma. Film 3 was deposited in the same manner as Film 2, but featured a nitrogen plasma at 100 W, instead of the 200 W used for Films 1 and 2. Table 1 also shows the elemental composition of all three films deposited at the various conditions determined using Rutherford backscattering. It should be noted that in this particular case analysis of the films for hydrogen content was not performed, though there was likely residual hydrogen remaining behind in the films. Most relevant for comparisons to data on films derived from the precursor HMDS described in Example 2 are C:Si and N:Si ratios which can be calculated independent of the H content. Because 1,3,5-trisilapentane contains no nitrogen, all of the nitrogen incorporated into films derived from 1,3,5-trisilapentane can be attributed to the presence of nitrogen gas added during the plasma treatments. The selection of specific treatment conditions provides some means for adjusting the final film composition.

TABLE 1

Elemental Content of Deposited Films

BULK Films

| Element | Film 1: Deposition: 0.25 sec/20 Watt dep Treatments: 1.5 sec $H_2$ plasma at 100 W, 2.10 sec $N_2$ Plasma at 200 W | Film 2 Deposition: 0.25 sec/20 Watt dep Treatments: 1.5 sec $H_2$ plasma at 100 W 2.5 sec He/Ar at 150 W 3.5 sec $N_2$ Plasma at 200 W | Film 3 Deposition: .25 sec/20 Watt dep, Treatments 1.5 sec $H_2$ plasma at 100 W 2.5 s He/Ar Plasma at 150 W 3.2 sec $N_2$ Plasma at 100 W |
|---|---|---|---|
| Si | 29 | 33 | 33 |
| C | 11 | 12 | 19 |
| N | 56 | 55 | 47 |
| O | 4 | 0 | 0 |
| Ar | 0.3 | 0.3 | 1 |

Approximate (average) thickness of film removed by 5 min exposure to dilute HF and etch raters based on 5 min etch time

| 30 Ang total 6 Ang/min | 20 Ang total 4 Ang/min | No significant etch <1 Ang/min |

Etch behavior was determined to be non-linear and, while not wishing to be bound to any particular theory, appears to involve the relatively rapid removal of a thin oxidized surface layer, after which subsequent extended exposure to the etchant has little effect. However, for consistency in comparing results to those of Example 2, rates are reported based on a 5 min etch time in 100:1 HF. Similar behavior was observed using 6:1 BOE (6 parts concentrated $NH_4F$/1 part concentrated HF).

Figure 1B:
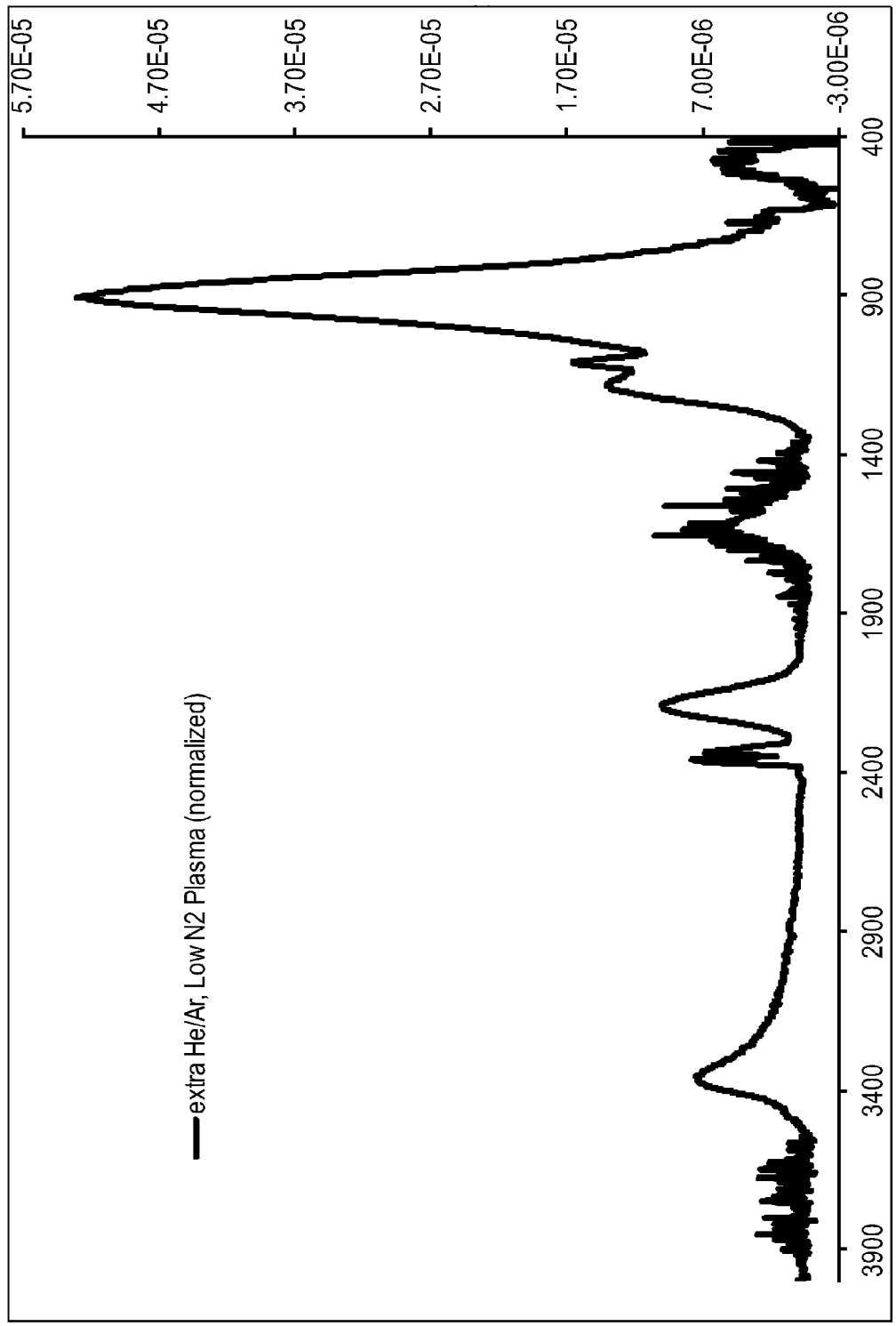
Figure 1C:
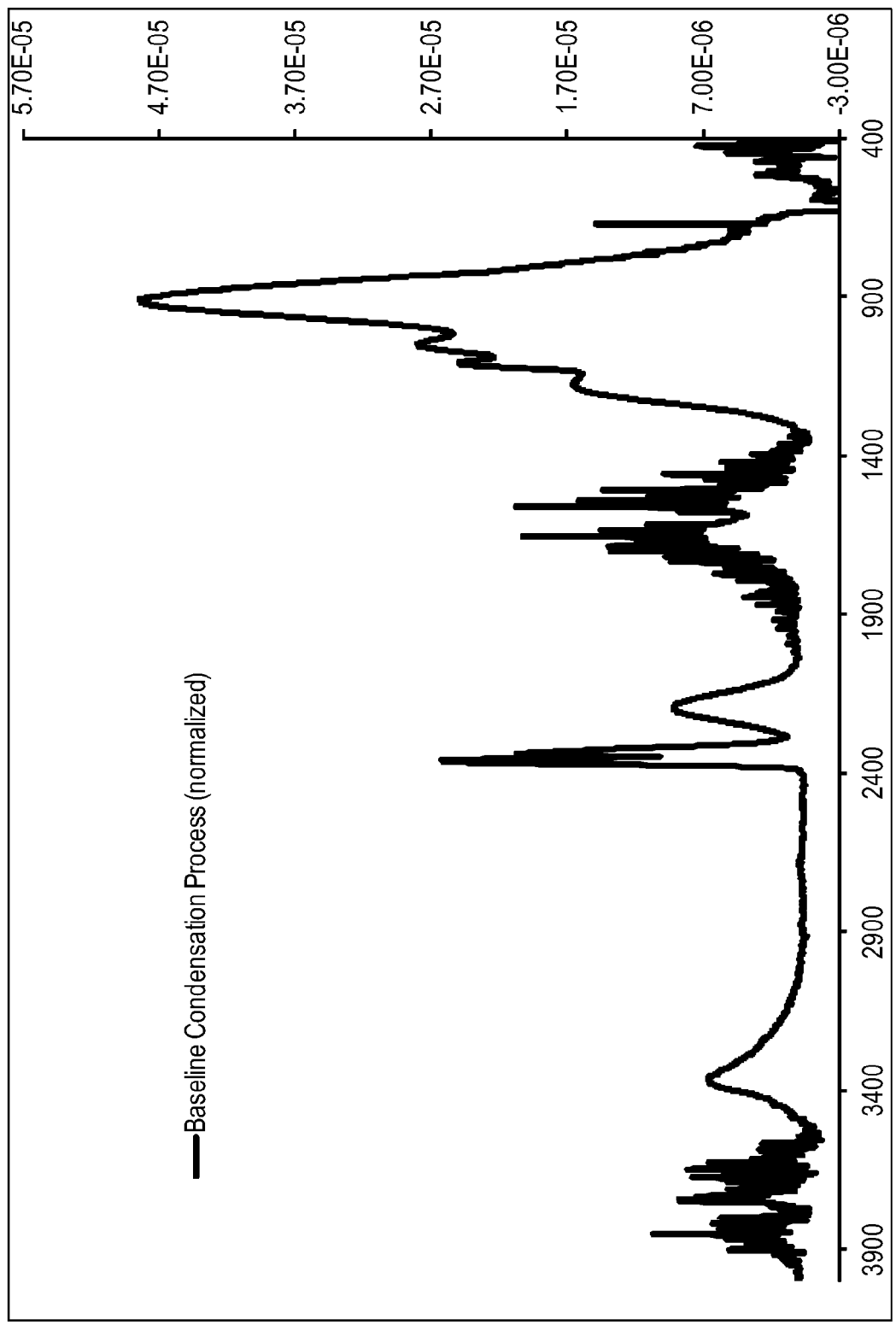

FIGS. 1A-C are graphical representations of Fourier transform infrared (FTIR) spectra of the SiCN films of Example 1. Film 1, which is a typical baseline process condition, is represented in FIG. 1C. Film 2 is represented in FIG. 1B. Film 3 is represented in FIG. 1A. Each of the three datasets was normalized. The peak at about 3300 cm$^{-1}$ corresponds to N—H bonding. The peak at about 2300 cm$^{-1}$ corresponds to $CO_2$ present in ambient air. The broad peak centered at around 900 cm$^{-1}$ corresponds to SiCN and the shift seen from Film 1. The shift seen from films 1 to Film 3 is attributable to increasing carbon content, which also corresponds to their increasing resistance to wet HF etch chemistries.

Example 2

Additional SiCN films 4 through 6 were deposited using the precursor hexamethyldisilazane (HMDS) which has the formula $[(CH_3)_3Si]_2NH$. Accordingly, HMDS does not contain a carbon atom bridging at least two silicon atoms. HMDS has a 3:1 carbon to silicon ratio, with each silicon atom bound to three methyl substituents and one nitrogen. A series of cyclic depositions analogous used in depositing Films 1 through 3 were employed for the deposition of Films 4, 5, and 6, with results listed in Table 2 below. In each case, a "seed" layer was deposited at 20 W RF, 6 Torr, delivering HMDS from a pressure controlled vapor draw ampoule using Ar carrier gas analogous to conditions employed for 1,3,5-trisilapentane in Example 1. The deposition rate was determined to be approximately linear with total plasma on time/cycle and the initial step followed by a long inert gas purge to remove residual precursor from the chamber. Film 4 was deposited using only a hydrogen plasma treatment cycle. Film 5 was deposited with an $H_2$ plasma followed by a $N_2$ plasma. Film 6 was deposited using plasma comprising a mixture of $H_2$ and $N_2$.

Table 2 also shows the elemental content of Films 4 through 6, as determined by Rutherford backscattering, as well as 100:1 wet HF etch rates. It should be noted that unlike in Films 1 through 3, Rutherford backscattering analysis for Films 4 through 6 included a determination of hydrogen content in the films. Accordingly, direct comparisons between Films 1 through 3 and Films 4 through 6 are limited to ratios of carbon to silicon or nitrogen to silicon.

TABLE 2

Elemental Content of Deposited Films

| | | Treatment | |
| --- | --- | --- | --- |
| Element | Film 4 10 sec $H_2$ Plasma at 300 W | Film 5 1.10 sec $H_2$ Plasma at 300 W 2.2 sec $N_2$ Plasma at 100 W | Film 6 7 sec $H_2$ + $N_2$ Plasma at 200 W |
| Si | 25.50% | 26.50% | 32.50% |
| C | 34% | 19% | 0% |
| N | 18.50% | 38.50% | 47.5% |
| O | 0% | 3% | 9% |
| H | 22% | 13% | 11% |
| 100:1 DHF Etch Rate | <1 Ang/min | >20 Ang./min (complete loss or >100 A thick film in 5 min. | >20 Ang./min. (complete loss of >100 A thick film in 5 min. |

Figure 2:
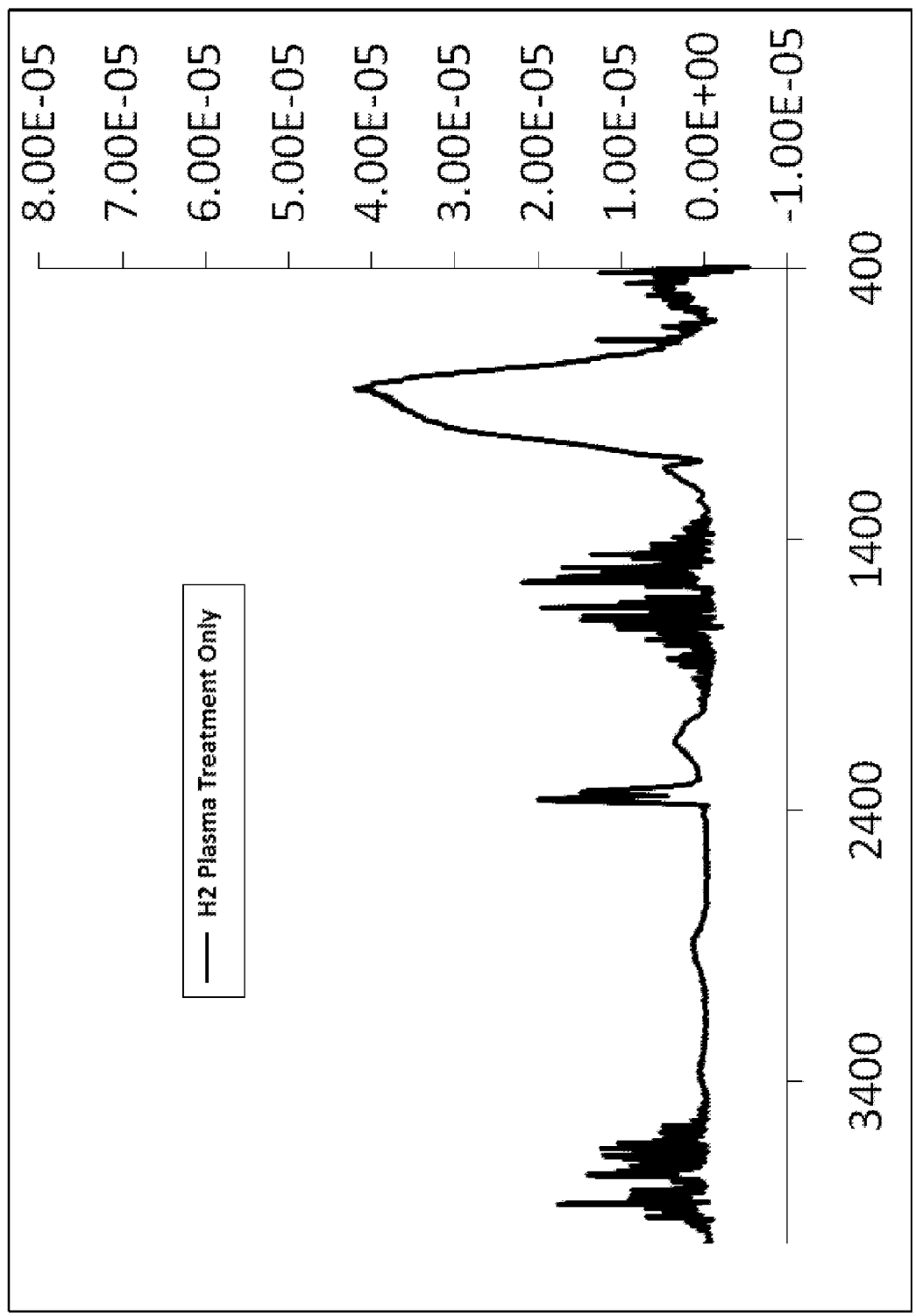
FIG. 2 is a Fourier transform infrared spectra of a SiCN film formed in accordance with an embodiment of the invention.
Figure 3:
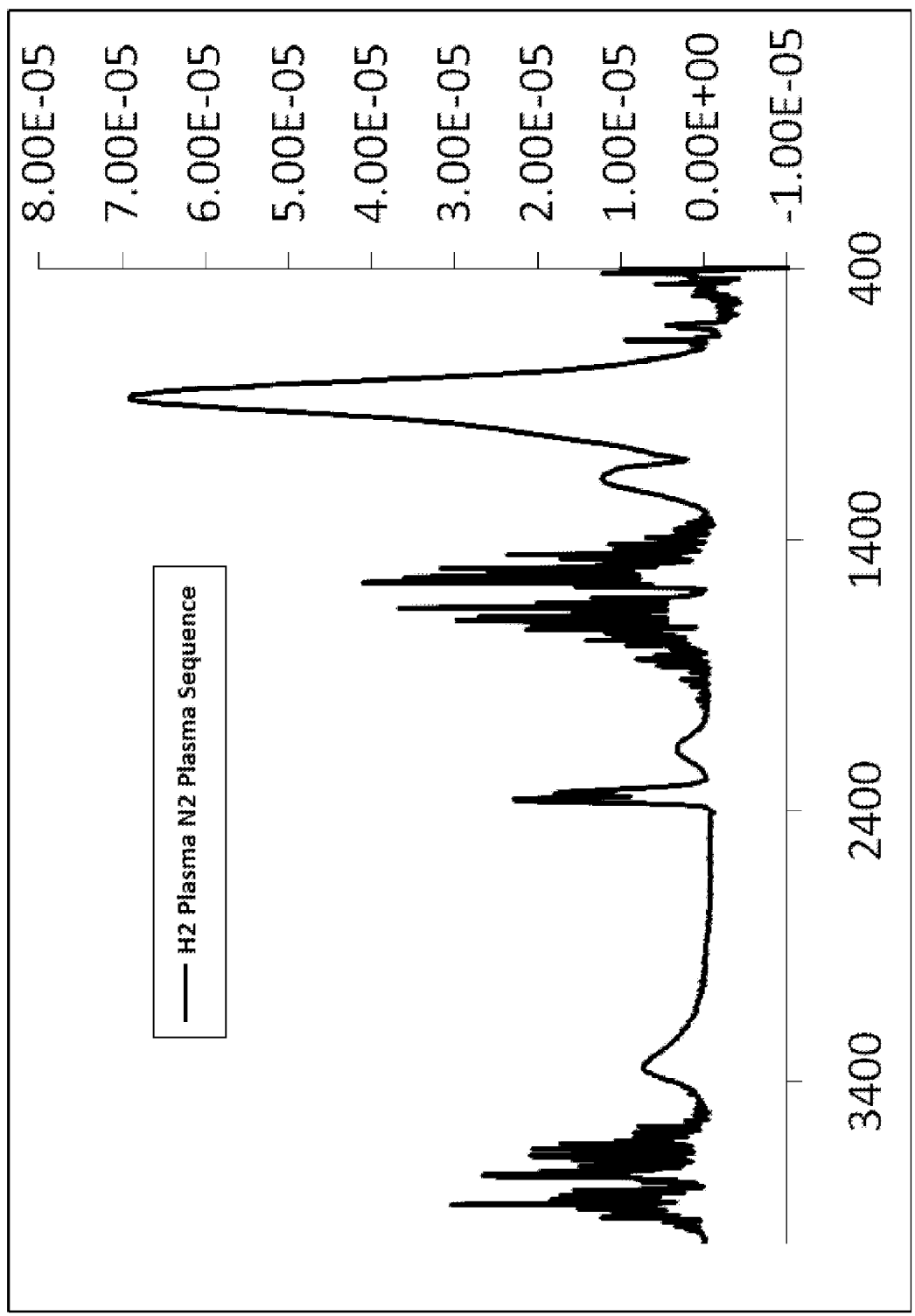
FIG. 3 is a Fourier transform infrared spectra of a SiCN film formed in accordance with an embodiment of the invention.
Figure 4:
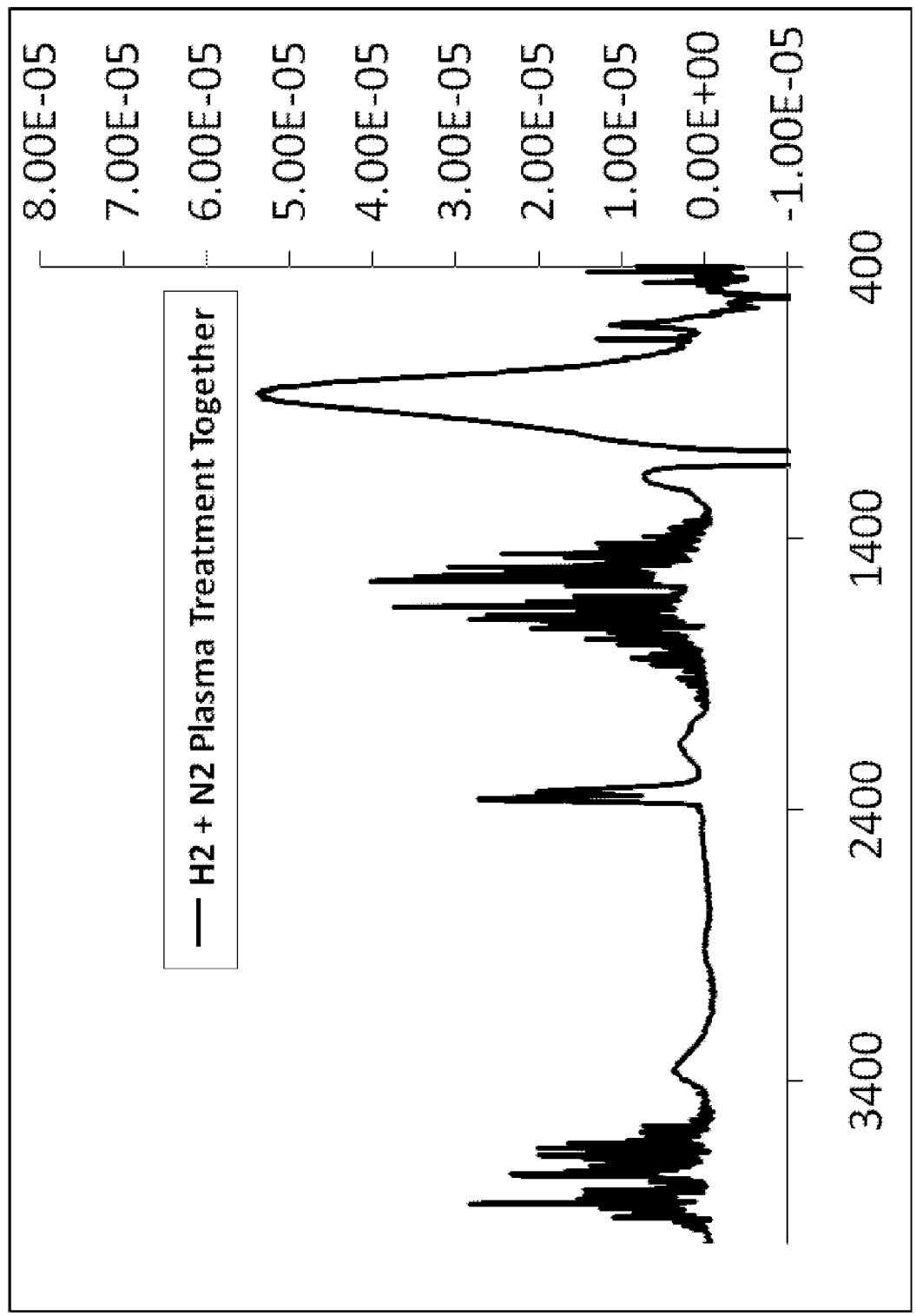
FIG. 4 is a Fourier transform infrared spectra of a SiCN film formed in accordance with an embodiment of the invention.

FIGS. 2-4 are graphical representations of Fourier transform infrared (FTIR) spectra of the Films 4 through 6, respectively. The results in FIG. 2 represent deposition followed by the use of an using an $H_2$ plasma only. The results in FIG. 3 represent deposition using an $H_2$ plasma followed by an $N_2$ (in sequence) plasma treatment analogous to that applied in Examples 1. The results in FIG. 4 represent deposition using a plasma comprising a mixture of $H_2$ and $N_2$, and result in complete removal of carbon from the film.

In contrast to the work with 1,3,5-trisilapentane, the conditions necessary to reduce C—H absorptions in the IR spectra and induce growth in the SiCN region at about 800-1000 $cm^{-1}$, were found to result in substantial removal of carbon. In fact, without any additional treatment the C:Si ratio, as determined by RBS, dropped from the initial value of 3:1 to only 1.3:1 While Film 4 was removed slowly in 100:1 HF, the application of additional steps involving a short $N_2$ plasma step (as seen in Film 5 and analogous to those employed in Example 1 films), or an alternative process which combined $H_2$ and $N_2$ plasmas into a single step (as seen in Film 6), underwent significantly higher carbon loss and exhibited low resistance to etching by 100:1 HF.

Interestingly, the $N_2$ plasma step added to each cycle of the process used for Film 4 process to give Film 5 resulted in the C:Si ratio decreasing from 1.3:1 to 0.72:1, with the result still being higher than the ratios between 0.38:1 and 0.58:1 measured for the 1,3,5-trisilapentane-derived Films 1-3. Yet it was the 1,3,5-trisilapentane-derived films which exhibited superior etch resistance.

While not wishing to be bound by any particular theory, these results suggest the bridging carbon atoms present in precursors (and low power seed films derived therefrom) are more effectively retained and converted to etch resistant carbides than carbon originally present in the form of terminal methyl groups. Furthermore, it should be noted that higher RF power levels and longer $H_2$ and/or inert gas plasma treatment times were necessary to promote condensation of HMDS derived seeds to a level approximating the properties of a 1,3,5-trisilapentane-derived films. All the films of Example 1 were prepared using a final Nitrogen plasma step (required for their conversion to SiCN—after which they were shown to still exhibit reasonably high (and useful) resistance to wet HF etch processes. However, applying a similar process in the preparation of Film 5 (derived from the precursor HMDS) resulted in its loss of HF etch resistance—even though the final C:Si ratio remained higher (0.75) than measured in any of the 1,3,5-trisilapentane derived films. It may be concluded that carbon originally present as "bridging" methylenes between Si atoms converts to a form exerting a much greater impact on etch behavior than can be estimated using compositional analysis alone. In the case of the 1,3,5 trisilapenetane, the addition of a nitrogen plasma step can effectively incorporate nitrogen without exerting a large effect on the C:Si ratio (dropping from the value of 0.67:1 calculated from the ratio in the precursor to 0.53:1 in the case of Film 3). Adding an analogous Nitrogen plasma step at the end of the densification process used for the HMDS Film 4 resulted in a much more significant impact on carbon content (1.3 dropping to 0.72 together with a severe degradation of etch resistance) suggesting the bonding of the retained carbon in each case is significantly different.

While it may indeed be possible to achieve a process with more classic, self-limiting reactivity by incorporating an active leaving group onto the HMDS molecule (by replacing one of the methyl substituents with a halide or cyanide), the stability of such a precursor may be severely compromised by the potentially reactive, albeit somewhat hindered, N—H bond already present. For this reason precursors possessing both bridging carbon and reactive Si—H bonds (such as 1,3, 5-trisilapentane) are particularly well suited as SiCN precursors, since carbon is efficiently retained while still permitting the introduction of Nitrogen (for example by inserting into Si—H bonds or Si—Si bonds). This results in the creation of reactive functionality not initially present in the precursor itself, thereby enabling use of schemes employing the various "activated" derivatives described herein, most or all of which would not be expected to be viable with an N—H functionality already present in the molecule, as would be the case with a material derived from HMDS.

Therefore, the films of Example 2 show that compositions exhibiting desirable etch properties required much longer and more aggressive $H_2$/inert plasma based densifications steps, after which films were still insufficiently stable to permit use of a nitrogen plasma activation step without significant loss of carbon and etch resistance. This demonstrates the superiority of Example 1 films, deposited according to various embodiments of the invention.

Thus, there is an apparent advantage of precursors such as 1,3,5-trisilapentane (which incorporate carbon in bridging positions between Si atoms) relative to more common precursors possessing non-bridging carbon substituents such as methyl (—$CH_3$), which is particularly evident when targeting applications requiring that the films exhibit high wet etch resistance to chemistries such as HF (100:1 $H_2O$/concentrated HF), or mixtures such as buffered oxide etch (a mixture on 6:1 concentrated NH4F to concentrated HF) designed to rapidly etch $SiO_2$.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to specific embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of forming a layer on a substrate surface, the method comprising:
   providing a substrate;
   in a PECVD process exposing the substrate surface to a carbosilane precursor containing at least one methylene bridging two silicon atoms;
   exposing the carbosilane precursor to a direct plasma to provide a carbosilane at the substrate surface;
   stripping away at least some of the hydrogen atoms; and
   exposing the carbosilane surface to a nitrogen source to provide a film comprising SiCN suitable as a low k dielectric film.

2. The method of claim 1 wherein the direct plasma has a value of about 10 W to about 200 W.

3. The method of claim 1, wherein the carbosilane precursor is exposed to the direct plasma for between 0.10 seconds and 5.0 seconds.

4. The method of claim 1, wherein the carbosilane precursor is one or more of 1,3,5-trisilapentane, 1,3-disilabutane, 1,3-disilacyclobutane and 1,3,5-trisilacyclohexane.

5. The method of claim 4, wherein the carbosilane precursor is 1,3,5-trisilapentane.

6. The method of claim 1, wherein exposing the carbosilane to a nitrogen source comprises exposing the carbosilane to a plasma containing nitrogen.

7. The method of 6, wherein exposing the carbosilane to a plasma containing nitrogen results in the formation of N—H bonds that promote irreversible attachment of a monolayer of the carbosilane to the substrate surface.

8. The method of claim 1, wherein exposing the carbosilane to a nitrogen source comprises flowing ammonia or nitrogen gas.

* * * * *